United States Patent [19]

Goldie, deceased

[11] Patent Number: 4,575,692
[45] Date of Patent: Mar. 11, 1986

[54] MICROWAVE DISCHARGE APPARATUS AND METHOD WITH DUAL FUNCTION PRIMING RESONATOR

[75] Inventor: Harry Goldie, deceased, late of Randalstown, Md., by Fritzi Goldie, administrator

[73] Assignee: The United States of America as represented by the Secretary of the Air Force, Washington, D.C.

[21] Appl. No.: 601,515

[22] Filed: Apr. 18, 1984

[51] Int. Cl.$^4$ .............................................. H01P 1/14
[52] U.S. Cl. ...................................... 333/13; 315/39; 333/17 L; 333/99 PL
[58] Field of Search .................... 333/13, 17 L, 99 PL; 315/39

[56] References Cited

U.S. PATENT DOCUMENTS

| | | |
|---|---|---|
| 2,540,148 | 2/1951 | Tawney . |
| 3,110,842 | 11/1963 | Hilliard . |
| 3,521,197 | 7/1970 | Broderick .............................. 333/13 |
| 4,155,053 | 5/1979 | Stitzer et al. ...................... 333/17 L |
| 4,155,054 | 5/1979 | Goldie et al. ..................... 333/17 L |
| 4,177,437 | 12/1979 | McLaughlin et al. ................ 333/13 |
| 4,193,047 | 3/1980 | Carter et al. ....................... 333/17 L |
| 4,395,684 | 7/1983 | Goldie et al. ........................ 333/13 |

Primary Examiner—Paul Gensler
Attorney, Agent, or Firm—Donald J. Singer; Gerald B. Hollins

[57] ABSTRACT

A microwave gas discharge apparatus for use as a limiter or TR device or the like and employing a primary discharge arrangement which has a single resonator used for priming the discharge device and determining the priming energy frequency.

14 Claims, 3 Drawing Figures

MICROWAVE DISCHARGE APPARATUS AND METHOD WITH DUAL FUNCTION PRIMING RESONATOR

RIGHTS OF THE GOVERNMENT

The invention described herein may be manufactured and used by or for the Government of the United States for all governmental purposes without the payment of any royalty.

BACKGROUND OF THE INVENTION

This invention relates to the field of microwave signal transmission along conductive transmission lines and to energy responsive elements which modify the transmission line characteristics in response to predetermined conditions.

Ionized gas plasma devices have been used in the radar art for changing the characteristics of a microwave transmission line in response to the presence of a high amplitude signal since the early days of radar technology. In a usual embodiment of such apparatus an ionized gas plasma device is employed in conjunction with a one-quarter wave shorted stub, a resonant tuned cavity, a duplexer, an impedance transformer or other articles of microwave "plumbing" for protecting low power sensitive portions of the radar apparatus from large energy signals present in the radar transmitter output. One form of ionized gas plasma device is frequently called a TR tube or an ATR tube and serves to admit large amplitude signals to the radar antenna while blocking such signals from the radar receiver. At a subsequent transmitter off time such devices allow the passing of low amplitude signals from the antenna to the receiver.

In addition to the normal use of TR and ATR ionized gas plasma devices, certain conditions encountered in the radar art make the use of a signal limiting gas plasma device desirable. Conditions calling for use of such a limiting device include the close spacing of more than one radar set as might be accomplished on an aircraft or watercraft where the large amplitude signals from one radar set can be received in the near-by radar set and where the frequency of the two radar sets may be sufficiently different to preclude reliable operation of the normal tuned circuit TR and ATR devices. In addition, the presence of finite firing time delays in most TR and ATR devices call for fast acting limiter devices which can achieve operation before such delays permit damage to sensitive system components.

In recent years the use of microintegrated circuits in the radar art has intensified the need for improved microwave limiting devices that are compatible with the dimensions and technology of the integrated circuit art—compatibility with the planar radio frequency transmission lines employed in the integrated circuit art is especially needed. A significant problem in adapting gas plasma devices to the integrated circuit art is concerned with the arrangement used for priming the gas plasma so as to decrease the time and energy required of the radar transmitter signal before achieving ionization and signal diversion. Existing priming methods such as dc keep-alive devices and radioactive igniters have not been mechanically compatible with a small quartz device containing an active plasma such as might be used in the integrated circuit art. The radio active igniters additionally post a compatability problem with the adjacent integrated circuit, since many of the semiconductor devices used in such circuits are radiation sensitive.

The prior patent art includes several examples of ionized gas devices which are usable in radar circuitry for protection and signal steering purposes. Included in this prior art is the patent of G. L. Tawney, U.S. Pat. No. 2,540,148, which discloses a gas filled TR box that may be employed in a plurality of locations in the signal transmitting paths of a radar set. The Tawney apparatus includes the concept of a resonant cavity, the use of low pressure ionizable gases such as hydrogen and water, and the use of a keep-alive discharge within the resonant cavity of the protective device.

The patent of R. C. Hilliard, U.S. Pat. No. 3,110,832, contemplates the use of a microwave shutter structure for attenuating high energy signals and protecting sensitive microwave receiver components. In the Hilliard apparatus, the shutter structure is combined with a TR tube which employs low pressure gases such as nitrogen, argon or Freon ® that are operated in the presence of a keep-alive discharge. The name Freon ® is a registered trademark of E.I. DuPont de Nemours and Company.

The patent of D. C. Broderick, U.S. Pat. No. 3,521,197, discloses a power limiter device for a waveguide wherein a gas filled quartz cylinder of precise dimensions is mounted between two waveguide apertures at a point of maximum voltage in a standing-wave pattern. The Broderick device contemplates use of both a gas filled tube and a semiconductor or varactor diode. The Broderick patent also discloses alternate embodiments for a power limiter in which a series of ionization gaps sealed in a low pressure environment together with a keep-alive electrode are employed. In yet another embodiment, Broderick discloses the combination of a power limiter and an ionizable gas TR tube with the limiter section being comprised of solid state elements.

Two of my own prior patents, each involving a coinventer and one assigned to my present employer and one to the Government of the United States concern the use of a yttrium-ion garnet (YIG) spherical element for performing a power limiting and signal filtering function. The first of these patents, U.S. Pat. No. 4,155,053 is concerned with improving the coupling between the signal transmission path and the YIG element through the use of a groove in the transmission line structure while the second, U.S. Pat. No. 4,155,054 is concerned with mounting the YIG element within the microwave slotted resonant structure.

A third of my prior patents, U.S. Pat. No. 4,277,437, also involving a coinventor and assignment to the Government of the United States is concerned with a TR switch structure which is fabricated from boron nitride and filled with a low pressure halogen gas such as chlorine. The U.S. Pat. No. 4,277,437 provides for improving the thermal conductivity by which energy is removed from the ionized gas of the TR tube and improving the susceptibility of the TR switch to the gas cleanup mode of failure.

A fourth of my prior patents, also involving coinventors and an assignment to the Government of the United States, U.S. Pat. No. 4,193,047, discloses a microwave power limiter which employs a dielectric resonator structure having a low threshold power, a large dynamic range, and mechanical and temperature stability. The U.S. Pat. No. 4,193,047 contemplates the use of a YIG dissipating element biased by a magnetic field and energized by the radio frequency magnetic field existing within a waveguide structure.

A fifth of my prior patents, U.S. Pat. No. 4,395,684 and a related technical article "An RF-Primed All-Halogen Gas Plasma Microwave High-Power Receiver Protector" appearing in the Institute of Electrical and Electornic Engineers Transactions on Microwave Theory and Techniques, Volume MTT-30, Number 12, December 1982, at pages 2177-2184, concern the concept of using radio frequency energy for achieving gas priming in a plasma limiter device. Both of these documents originate with myself and a colleague and each includes an interest by the government of the United States. As described in these documents, radio frequency energy can be advantageously employed to replace or supplement the radioactive and DC keep-alive discharge priming arrangements previously used in microwave limiter devices.

This use of radio frequency priming in plasma limiter devices provides a notably improved arrangement wherein physical contact between the active limiter media such as an ionized gas and metallic elements in the microwave structure can be completely avoided. This improvement is based on sealing of the limiter media within a completely inert vessel such as a quartz capillary tube. With this sealed isolation the desired media standby ionization is achieved by radio frequency electromagnetic field coupling into the media capillary rather than with the previous arrangement of electrodes passing through the capillary walls or sealing a radioactive material within the media container. These previous arrangements have several disadvantages, including the promotion of contamination (e.g. gas cleanup) of both the media material and the ionization producing element.

As is indicated in the December 1982 article, the ability to employ RF primed limiter devices in all stages of a receiver protector limiter device also combines desirably with the characteristics of certain PIN diodes, allows use of aluminum or other desirable metals in the microwave components, allows great freedom in selecting the gases employed in the limiter media and provides other advantages over previous arrangements. An especially notable of these other advantages is the enabling of extremely fast ionization recovery periods in the limiter gas media in comparison with prior arrangements. This improvement enables improved radar range and pulse repetition frequency performance, for example. This improvement is moreover principally achieved through the increased freedom available in selecing media gas composition when gas to metal contact is removed as a consideration.

The present invention contributes to the desirability of this isolated media arrangement in limiter devices by enabling the achievement of a reliable and stable priming discharge in the isolated media—a discharge that is immune to frequency drift in the priming energy source as inherently tends to occur when microwave equipment is exposed to military temperature extremes, for example.

SUMMARY OF THE INVENTION

The invention provides a novel microwave device of the gas tube variety which is compatible with integrated circuit techniques. The device, which may be a limiter, is primed into a low threshold condition by externally supplied microwave radio frequency energy using a single resonator circuit. The priming arrangement also has improved stability characteristics.

DETAILED DESCRIPTION

Figure 1:
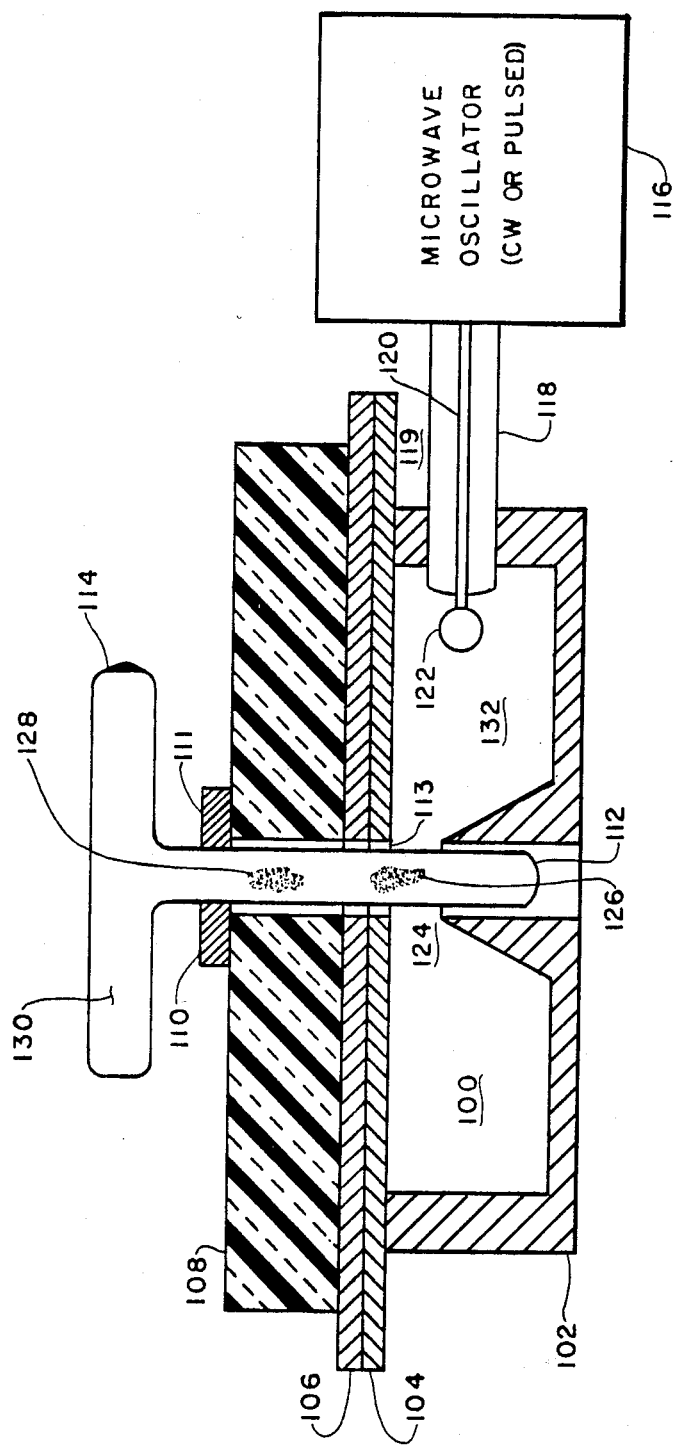
FIG. 1 shows a microstrip plasma device using a reentrant cavity form of microwave resonator.

In FIG. 1 of the drawings there is shown a microwave plasma device which employs radio frequency priming of the gas within a capillary tube. The capillary tube in FIG. 1 has dimensions that are compatible with those of an integrated circuit structure and can be made of quartz or other materials compatible with the function recited herein. At 100, in FIG. 1 a coaxial reentrant microwave cavity 100 having air dielectric 132, is coupled to the gas 130 within the capillary tube 112. The cavity to gas coupling occurs at a region of high cavity electric field 124. As a result of this electric field coupling of microwave energy to the gas 130 a region of ionized plasma 126 is produced within the capillary tube.

The FIG. 1 apparatus also includes a planar microwave transmission line comprised of the elements 110 and 111. This transmission line conducts microwave signal energy between a source and a load which are assumed to be located behind and in front of the FIG. 1 page. The transmission line elements 110 and 111 are shown to be mounted on an insulating substrate 108 which is in turn mounted on a conductive ground plane member 106. The capillary tube structure 112 is shown to include a gas reservoir 114 and to contain a second region of ionized plasma 128 produced by the electric field from the transmission line elements 110 and 111.

The microwave cavity 100 in FIG. 1 includes a conductive body portion 102 and is excited by a microwave oscillator circuit 116 which is coupled to the cavity by way of a coaxial transmission line 119. The transmission line 119 is shown cut away in FIG. 1 and includes outer conductor 118 and a center conductor 120. The transmission line 119 is shown to be terminated by a ball-shaped microwave antenna element 122 located within the cavity 100. The antenna 122 and transmission line 119 serve to communicate energy bidirectionally between the cavity 100 and the microwave oscillator 116. The microwave cavity 100 is shown to be closed by a second ground plane member 104 which is located adjacent the ground plane 106 and may be fabricated as a part of the ground plane 106 if desired.

Operation of the FIG. 1 apparatus contemplates that sufficient energy will be supplied to the cavity 100 by the microwave oscillator circuit 116 to maintain the region of ionized plasma 126 even though the signal transmitted between the transmission line elements 110 and 111 is small or absent. By way of this quiescent ionization or priming discharge 126, the amount of signal energy required in the transmission line elements 110 and 111 to initiate the active second region of ionized plasma 128 is significantly decreased. Because of this reduced energy and signal level requirement, the effective signal threshold for initiating the second region of ionized plasma and achieving the desired change in transmission line characteristics is sharply reduced.

The cavity 100 in FIG. 1 serves the dual function of providing a coupling transducer for transferring microwave radio frequency energy from the cavity 100 to the gas 130 while also functioning as the resonant tank circuit for the microwave oscillator 116. The microwave oscillator 116 may be fabricated using a field effect transistor, bipolar transistor or vacuum tube or other device capable of operation at microwave frequencies. It is to be understood that energy transfer between the oscillator transistor or vacuum tube and the cavity 100 is bidirectional in the sense that the natural frequency of the cavity 100 determines the operating frequency of the microwave oscillator 116 and the oscillator supplies the radio frequency energy for exciting the cavity 100 and the gas 130. At lower radio frequencies a bidirectional coupling of this type could involve two signal paths and separate transistor input and output terminal connections with the resonant circuit, however, at microwave frequencies, as is known in the art, the single transmission line 119 is capable of performing such bidirectional coupling.

Use of a single resonator such as the cavity 100 for both energy coupling and microwave oscillator frequency determination significantly improves the performance of the FIG. 1 apparatus in the presence of several practical operating conditions. These conditions include the drift of component characteristics as a result of age and temperature. This improvement can be better understood by considering that a first blush approach to achieving microwave priming of the gas 130 would, for example, involve the use of a microwave oscillator which contained an oscillator resonator or some other form of frequency determining component together with a unidirectional coupling path between the oscillator and a gas coupling device such as the cavity 100. An arrangement of this type can easily be understood to be sensitive to such changes as nontracking of the resonant frequencies of the cavity and the microwave oscillator in the presence of environmental temperature changes. An arrangement of this type might, for example, achieve satisfactory priming of the gas 130 at room temperature but experience inadequate gas priming at low or high temperatures where the natural frequencies of the cavity 100 and the frequency determining element in the microwave oscillator could be different. A similar result would be expected after aging of the oscillator and cavity components and with drifting of the oscillator power supply.

It should be noted that a combination resonator, using, partial air-fill and partial high dielectric constant solid material, could be employed for the cavity 100 in the FIG. 1 apparatus so that a smaller cavity volume could be achieved. A two-component dielectric of this type can also be used to compensate oscillator frequency for temperature sensitivity by appropriately selecting the volume ratios of the two dielectric materials. Solid dielectric materials can be conveniently obtained with a wide range of frequency versus temperature sensitivity characteristics. In the FIG. 1 appartus, compensation of oscillator frequency change with temperature is of lesser importance than may be the reductions of cavity size since the tracking of two resonators in temperature is of reduced importance herein as explained above.

The ground planes 104 and 106 in FIG. 1 establish a high degree of isolation between the transmission line 110-111 and the priming oscillator signals. A small opening 113 in the ground plane allows the capillary tube structure 112 to be common to both the transmission line and priming oscillator radio frequency fields.

The FIG. 1 apparatus comprises a simple shunt-mounted limiter which does not significantly perturb the main signal line when passive but will provide 20 dB of isolation between signal and priming radio frequency fields when driven above the threshold of the gas 130. The FIG. 1 apparatus will function independently of duty factor within wide limits and will achieve significantly better parameters than solid state (e.g., PIN diode) active elements. The use of halogen gases such as chlorine, fluorine, bromine, or one of the synthetically fabricated Freon (a trademark of E.I. DuPont de Nemours and Co.) gases in the capillary tube 112 allows the use of higher power levels in the FIG. 1 apparatus and provides considerably shorter recovery periods than does a PIN diode structure. The FIG. 1 apparatus is also free of a requirement for a transistor video driver for the PIN diode.

The FIG. 1 apparatus has been described as being suitable for use with planar integrated circuit networks involving the transmission of microwave energy between signal nodes of a network; it should be understood, however, that the FIG. 1 transmission line is intended to be generic to a large variety of transmission lines which could be employed. Most notably the possible types of transmission line comprise the microstrip line and its derivative such as a slot line, inverted microstrip, suspended microstrip, microstrip with overlay, strip dielectric, and inverted strip dielectric waveguides. Other applicable forms of transmission lines include strip lines, including air stripline structures. A large variety of such transmission lines are described in the text, "Foundations for Microstrip Circuit Design", authored by T. C. Edwards, and published by John Wiley Company in 1981. The Edwards book is hereby incorporated by reference into this specification.

In addition to the halogen gasses possibly useable in the capillary tube structure 112 certain nonhalogen gasses have also been employed in microwave gas tubes; the list of potentially useful nonhalogen gasses is comprised of argon, krypton, oxygen, nitrogen, and others. As is known in the microwave art, the selection of an appropriate gas is a matter of design compromise and involves consideration of introduced signal noise, desired operating life and other factors. Argon, for example, is found to produce an intense plasma which tends to drift into the main signal path and produce signal noise, in addition, some of the possible gasses give rise to shorter operating life than is desired in reliable equipment.

Figure 2:
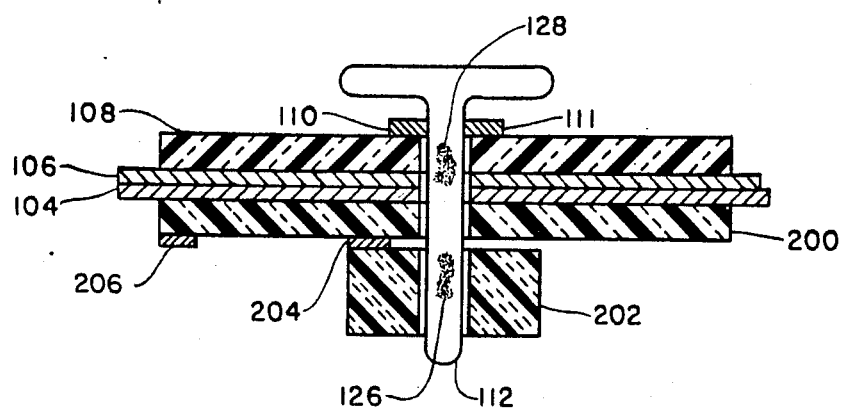
FIG. 2 shows a plasma device which employs a solid state dielectric resonator.

An alternate embodiment of the FIG. 1 apparatus is shown in FIG. 2 of the drawings. The FIG. 2 embodiment includes the capillary tube 112, the ground planes 104 and 106, and the signal transmission line elements 110 and 111, which are supported on the insulating substrate 108 all as shown in FIG. 1. In addition to these FIG. 1 elements, the FIG. 2 drawing includes the conductors 204 and 206 which are part of a microwave energy source such as the oscillator 116 in FIG. 1, and which serve to couple microwave frequency energy into a soild dielectric resonator 202. The conductors 204–206 are mounted on an insulating substrate 200 which in turn is mounted on the ground plane member 104. The regions of ionized plasma 126 and 128 in FIG. 2, correspond to the similar regions in FIG. 1 and result from radio frequency energy coupled into the capillary tube gas by the resonator 202 and the transmission line elements 110 and 111.

The solid dielectric resonator 202 in FIG. 2 is used in lieu of the air-filled cavity resonator 100 in FIG. 1. A solid dielectric resonator provides the advantage of the priming energy source being in microintegrated circuit form in order that the priming energy conductor pattern may be fabricated at the same time as the signal transmission line elements 110 and 111. In the case of the FIG. 2 embodiment, coupling to the resonator is accomplished merely by locating the resonator adjacent the radio frequency conductors 204 and 206. As suggested by the illustrated relative sizes of the FIG. 1 and 2 resonators, the solid dielectric resonator of FIG. 2 provides a smaller size embodiment than is normally achievable with the air-filled cavity resonator of FIG. 1.

Figure 3:
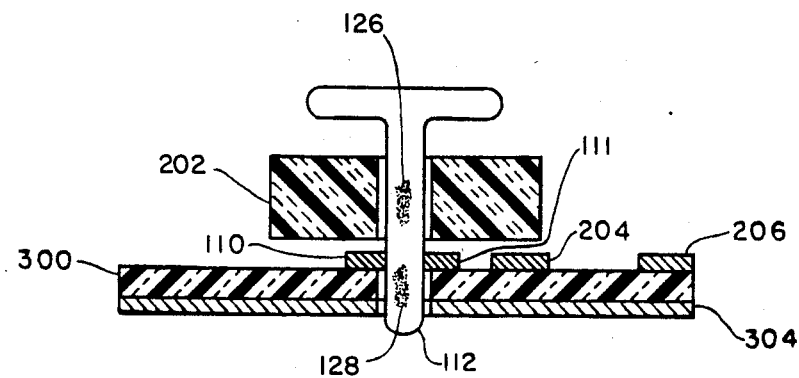
FIG. 3 shows another arrangement of a plasma device which employs a solid state dielectric resonator.

FIG. 3 of the drawings shows a second alternative to the FIG. 1 embodiment of the apparatus wherein the priming oscillator conductors 204 and 206 are fabricated on the same substrate 300 and on the same side of the ground plane 304 as are the transmission line elements 110 and 111. An important consideration in the FIG. 3 embodiment is the selecting of resonator dimensions and element spacings such that there is an acceptable small degree of signal coupling between the priming circuit and the transmission line elements 110 and 111 in their FIG. 3 locations. A significant contribution to achieving this small coupling can be realized by causing the resonator major dimensions to be significantly smaller and on the order of one-tenth or less of the signal wavelengths involved in the transmission line elements 110 and 111.

The use of a resonator of the cavity or other type has been found a desirable arrangement for coupling a secondary source of microwave energy to the gas of a microwave limiter or TR device for maintaining a primary discharge in the gas. In addition, the use of a common resonator for both the element controlling the timing oscillator frequency and as a gas tube electric field enhancement structure eliminates problems associated with temperature induced frequency drift, component aging and power supply variations. As shown in the three embodiments of FIGS. 1-3, the common resonator may be located above or below the ground plane structure. In these embodiments, if the oscillator is emitting power above the threshold to ionize the gas in the quartz stem, then the priming discharge will sustain as the frequency drifts because the gas-filled stem is located in the high electric field region of the cavity or resonator and this field is not diminished by a frequency mismatch between oscillator and resonator. In the FIG. 1 embodiment, it is possible for the cavity be operated in the TM010 mode which is known in the microwave art.

A change from a no-plasma quiescent condition to an active but weakly ionized priming state can be expected to shift the frequency of the microwave oscillator 116 by only a few megahertz because of the very small plasma volume contemplated in the stem of the capillary tube 112. As is known in the microwave art, empty space as is encountered in the quiescent condition of the cavity 100 is capacitive in nature, however, free electrons which lag a radio frequency electric field in an active plasma tend to be inductive in nature and therefore produce a slight change in the cavity impedance.

As indicated by the alternative continuous wave or pulsed nature of the microwave oscillator 116 in FIG. 1, in some embodiments of the invention it may be desirable to pulse the operation of the primary oscillator in order to achieve longer operating life for a limiter apparatus or in order to achieve lower receiver noise during the nonpriming portion of the pulse waveform. The selections of suitable pulsing waveforms and the achieving of a rapid primary ionization upon return of the priming energy are considerations treated in the prior art.

While the apparatus and method herein described constitute a preferred embodiment of the invention, it is to be understood that the invention is not limited to this precise form of apparatus or method and that changes may be made therein without departing from the scope of the invention which is defined in the appended claims.

I claim:

1. Microwave apparatus comprising:
    planar microwave transmission means for conveying electrical energy signals of microwave radio frequency between nodes in a microwave electrical network;
    gas-filled capillary tube means electromagnetically coupled with said transmission means for selectively modifying the signal transmission characteristics thereof;
    a source of capillary gas priming microwave energy; and
    microwave resonator means coupled with the gas in said gas-filled capillary tube means and with said source of gas priming microwave energy for both conveying said priming energy to said capillary tube means gas and determining the microwave operating frequency of said gas priming microwave energy source.

2. The apparatus of claim 1 wherein said coupling between said resonator means and said source of priming microwave energy includes bidirectional coupling means conveying energy from said source of priming microwave energy to said resonator means and returning energy from said resonator means to an energy feedback node in said priming energy source for both energizing said resonator coupled capillary tube gas and determining the microwave operating frequency of said priming microwave energy source;
    whereby the frequency of said priming microwave energy is coincident with the natural frequency of said resonator and priming energy ionization of said capillary tube gas is minimally subjected to diverging resonator and priming energy frequency drift.

3. The apparatus of claim 1 wherein the coupling between said transmission means and said gas-filled capillary tube means and the coupling between said resonator means and said gas-filled capillary tube means are at separated locations along said capillary tube means.

4. The apparatus of claim 3 further including a signal isolating ground plane member located adjacent said transmission means and said resonator means.

5. The apparatus of claim 4 wherein said planar microwave transmission means includes regions of high transmitted signal electric field intensity and regions of lower electric field intensity and wherein said gas-filled capillary tube means is located in a region of high transmitted signal field intensity.

6. Microwave apparatus comprising:
    a microwave resonator;
    a source of microwave electrical energy excitationally coupled with said resonator and including a microwave oscillator circuit having an input portion receiving feedback energy from said resonator;

microwave signal transmission means for conveying a microwave signal;

gas tube limiter means coupled with said microwave signal transmission means for modifying the electrical characteristics thereof in response to transmitted signal magnitude, said limiter means being also coupled with said microwave resonator and receiving gas priming energy therefrom.

7. The apparatus of claim 6 wherein said gas tube limiter contains at least one gas component taken from the group consisting of oxygen, nitrogen, argon, krypton, chlorine, flourine and bromine.

8. The apparatus of claim 6 wherein said microwave resonator includes a microwave cavity structure.

9. The apparatus of claim 6 wherein said resonator includes a solid state dielectric material.

10. The apparatus of claim 6 wherein said capillary tube is comprised of quartz.

11. The apparatus of claim 6 wherein said microwave signal transmission means is a portion of an integrated circuit.

12. The apparatus of claim 6 wherein said signal transmission means includes a planar transmission line.

13. A method for operating a microwave threshold device to increase threshold stability in the presence of component drift comprising the steps of:

locating the threshold device along a microwave signal transmission line at a point developing large signal electric field and tight signal to threshold device coupling;

priming the threshold device with a level of microwave energy sufficient to reduce the transmission line signal needed to reach said threashold;

coupling said priming energy to said threshold device through a microwave resonator;

controlling the frequency of said priming energy with the same resonator used to couple said priming energy to said threshold device.

14. The method of claim 13 wherein the threshold device is a gas-filled limiter and wherein said priming step includes coupling a sufficient quantity of energy into said gas to maintain a stand-by ionized region therein at a location separated from the coupling of the limiter with said signal transmission line.

* * * * *